United States Patent [19]

Shields

[11] Patent Number: 4,839,707

[45] Date of Patent: Jun. 13, 1989

[54] LCMOS DISPLAYS FABRICATED WITH IMPLANT TREATED SILICON WAFERS

[75] Inventor: Steven E. Shields, San Diego, Calif.

[73] Assignee: Hughes Aircraft Company, Los Angeles, Calif.

[21] Appl. No.: 257,178

[22] Filed: Oct. 13, 1988

Related U.S. Application Data

[63] Continuation of Ser. No. 90,188, Aug. 27, 1987, abandoned.

[51] Int. Cl.[4] .................. H01L 27/22; H01L 27/12; H01L 27/02
[52] U.S. Cl. ..................... 357/23.7; 357/4; 357/23.6; 357/41; 350/332; 350/334; 350/335; 350/336
[58] Field of Search .............. 357/4, 23.6, 23.7, 41; 350/332, 334, 335, 336

[56] References Cited

U.S. PATENT DOCUMENTS

| | | | |
|---|---|---|---|
| 3,862,360 | 1/1975 | Dill et al. | 178/7.3 D |
| 3,895,272 | 7/1975 | Smolko et al. | 317/256 |
| 4,103,297 | 7/1978 | McGreivy et al. | 340/324 |
| 4,239,346 | 12/1980 | Lloyd et al. | 350/334 |
| 4,385,292 | 5/1983 | Nonomura et al. | 350/334 |
| 4,431,271 | 2/1984 | Okubo | 350/334 |
| 4,432,006 | 2/1984 | Takai | 357/23.7 |
| 4,668,969 | 5/1987 | Yamazaki | 357/23.7 |
| 4,759,610 | 7/1988 | Yanagisawa | 357/23.7 |

FOREIGN PATENT DOCUMENTS

| | | |
|---|---|---|
| 0068094 | 4/1982 | European Pat. Off. . |
| 0070598 | 7/1982 | European Pat. Off. . |
| 3312743 | 4/1983 | Fed. Rep. of Germany . |
| 58-204568 | 11/1983 | Japan ................. 357/4 |
| 61-13228 | 1/1986 | Japan ................. 350/334 |

OTHER PUBLICATIONS

Sunata, et al., "A 640×400 Pixel Active-Matrix LCD Using a-Si TFT's," IEEE Transactions on Electron Devices, vol. ED-33, No. 8, Aug., 1986.

Luo, Fang-Chen, "Storage Capacitors In A TFT Addressed Liquid Crystal Display Panel," Xerox Disclosure Journal, vol. 9, No. 4, Jul./Aug. 1984.

VLSI Electronics Microstructure Science, Einspruch (1982) vol. 4 "Silicon-on-Insulalor for VLSI and VHSIC", Lam et al.

Primary Examiner—Andrew J. James
Assistant Examiner—Ngan Van Ngo
Attorney, Agent, or Firm—Joseph E. Szabo; Anthony W. Karambelas

[57] ABSTRACT

An improved LCMOS display device employing a silicon-on-insulator (SOI) substrate having an epitaxial silicon layer lying over an implant-generated dielectric layer. MOS device and capacitor elements used to activate the display are formed and interconnected in the epitaxial silicon. The implant-generated dielectric layer and underlying silicon substrate also serve as capacitor elements, thereby simplifying the structure and fabrication of the display device and providing improved operation through improved isolation of the MOS device elements formed in the epitaxial silicon from the substrate.

2 Claims, 3 Drawing Sheets

LCMOS DISPLAYS FABRICATED WITH IMPLANT TREATED SILICON WAFERS

This application is a continuation of application Ser. No. 090,188 filed Aug. 27, 1987 now abandoned.

BACKGROUND OF THE INVENTION

1. Field of the Invention

This invention relates to liquid crystal display systems and particularly to liquid crystal display systems including an array of pixel electrodes formed on a semiconductor backplate which are individually addressable through control of field effect switching devices such as metal oxide semiconductor (MOS) transistors.

2. Description of the Related Art

Liquid crystal display systems are known wherein a plurality of individually addressable cells or "pixels" are arranged in a matrix array, with each of the elemental cells of the array operating as a reflective light valve. In the absence of applied potential, the liquid crystal material is clear, and the cell appears dark to an observer. When electric potential above a threshold level is applied across the liquid crystal material, the liquid crystal scatters the light, much like a piece of frosted glass, and the cell appears white to the observer. The percentage of incident light which is scattered towards the viewing area is proportional to the magnitude of the potential applied to the liquid crystal cell, and consequently gray level display presentations may be produced.

In high resolution display systems, a composite presentation is built up from thousands of individually controllable elemental liquid crystal cells, each of which must be updated (the potential across the cell reprogrammed) at a rate sufficiently high to prevent observable flicker in the presentation. This may be accomplished by sandwiching a thin layer of liquid crystal material between a glass plate having a transparent electrode, and a backplate having a matrix array of reflective pixel electrodes formed on a semiconductor wafer. The backplate also contains the individual addressing circuitry and electrical storage circuitry disposed contiguous to the reflective pixel electrode for each cell. Typically, the addressing circuitry has included transistors such as field effect transistors and the storage circuitry has comprised capacitors with the reflective pixel electrode forming one element or plate of the capacitor. Each field effect transistor is utilized to address an associated element of the matrix array, and the associated storage capacitor maintains the applied potential across the liquid crystal cell until the information is updated. An example of this type of construction is disclosed and claimed in U.S. Pat. No. 3,862,360 issued to Dill et al., and assigned to the assignee of the present invention.

As taught in the above-identified Dill et al. patent, one element, or plate, of each storage capacitor may be formed in the semiconductor backplate by ion implantation. As further taught by Dill et al., the reflective pixel electrodes form the top plates of the storage capacitors and a plurality of highly doped areas in the substrate, each disposed under a respective one of the reflective electrodes, serves as the bottom plate of each capacitor.

Liquid crystal display systems of the type just described are reflective displays and therefore require incident light for their operation. The field effect transistors (FET's) used to control the storage capacitors in the backplate are extremely sensitive even to a very low level of incident light. As a result, the ability of the storage capacitors to maintain the applied potential across the liquid crystal cells between pulses is seriously affected by incident light. The shielding effect of the reflective electrodes which lie in a plane between the front of the display and the field effect transistors is insufficient to prevent incident light from discharging the potential on the storage capacitors. This is so because there must be a gap between respective columns and rows of electrodes.

An improved prior art display designed to alleviate adverse effects of incident light is disclosed in U.S. Pat. No. 4,103,297 issued to McGreivy et al. and assigned to the assignee of the present invention. The display of the '297 patent includes a semiconductor backplate having a major surface in which a heavily doped layer is created. An array of openings arranged in a plurality of columns and rows is left in the doped layer and a switching device (FET) is formed in the semiconductor backplate within each opening. A coplanar array of closely spaced reflective back electrodes is disposed above the backplate surface, with each back electrode extending entirely over a respective one of the openings. Means are provided for electrically connecting each of the FET's to the back electrode extending over it. In the preferred embodiment disclosed in the '297 patent, the connecting means comprises an intermediate electrode which is connected to the FET and particularly to its source. The intermediate electrode extends parallel to the semiconductor backplate surface to form a capacitor with the doped layer.

Spaced from the coplanar array of the back electrodes disclosed in the '297 patent is a transparent front electrode supported on a glass plate. Liquid crystal material is confined by appropriate sealing means between the front and back electrodes. Finally, switching devices are provided for applying an actuating voltage between selected ones of the back electrodes and the front electrode in order to effect a pictorial display. These switching devices may be metal oxide semiconductor field effect transistors (MOSFET's) having a source and a drain formed as doped regions in the substrate. Such liquid crystal displays employing MOS switching transistors are referred to as LCMOS displays.

In the prior art, a plurality of equidistant parallel gate buses has been used to activate the switching transistors associated with each display cell, while a plurality of equidistant parallel supply buses has been used to supply the display activating voltage to the switching transistors. Each of the equidistant parallel gate buses is connected to all of the gates of a respective row of switching transistors, while each of the equidistant parallel supply buses is connected to all of the drains of a respective column of switching transistors.

In fabrication of LCMOS displays according to the prior art, the addressing matrix including the MOS switching devices is made with standard P-Channel MOS technology. Building such circuitry using standard silicon processing techniques requires 9 mask steps for establishing source-drain diffusions, channel stop, gate oxide, polysilicon-to-diffusion contacts, polysilicon, light block, metal-to-polysilicon contacts, top metal, and bonding pads. Devices fabricated according to the foregoing processing techniques and structure are subject to line defects caused by one of three mechanisms: photolithography errors (scratches, photo-resist pinholes, bridging particles, etc.), oxide defects which result in polysilicon-to-substrate or diffusion shorts, or excessive leakage from the diffusions to substrate. One of the factors contributing to excessive leakage and shorts in prior art devices is that the supply buses connecting the drains are isolated from the substrate by only a diode breakdown voltage. Such line defects are a source of considerable reduction in production yields and increased production costs.

It has thus appeared desirable to reduce line defects in prior art LCMOS devices. It would be additionally desirable to reduce processing steps and complexity, which contribute to such defects.

SUMMARY OF THE INVENTION

It is, therefore, an object of the invention to improve liquid crystal displays;

It is another object of the invention to provide an improved structure for a LCMOS display;

It is another object of the invention to reduce line defects in LCMOS displays;

It is another object of the invention to increase isolation of supply buses from the device substrate in LCMOS structures;

It is still another object of the invention to provide a LCMOS structure which is simpler to fabricate.

According to the invention, a liquid crystal matrix display is fabricated on a special silicon-on-insulator (SOI) structure. This SOI structure includes a high quality epitaxial silicon layer disposed above a dielectric layer such as silicon nitride, which is in turn disposed above a silicon substrate. The high quality epitaxial silicon layer is implanted with dopant and etched to form switching device elements including channels, sources, and drains. A gate oxide is formed over the doped epitaxial silicon regions, and switching device gates are formed over the switching device channels. Suitable dielectric, pixel electrode metallization, light blocking masks and contact metallization may be deposited over the polysilicon according to well-known prior art procedures.

According to the foregoing structural approach, source regions formed by implanting the epitaxial silicon are employed as one plate of the storage capacitors used in the liquid crystal display. The underlying silicon substrate serves as the second plate of the storage capacitors with the intervening dielectric layer serving as the capacitor dielectric. In one embodiment, a matrix layout is employed wherein column supply buses are formed simultaneously with formation of the switching device elements, while row gate buses are formed simultaneously with creation of the switching device gates.

The SOI structure employed according to the invention has several advantages over prior art bulk P-channel devices. First, the SOI structure isolates both the polysilicon layer and the epitaxial silicon device layer from the bulk of the wafer, i.e. The substrate. This isolation eliminates shorts arising from leaky diodes. Second, by using the bulk of the wafer as one plate of the storage capacitors, two entire masking layers can b eliminated. The device of the invention is thus simpler to fabricate while retaining all of the advantages of prior art LCMOS devices.

BRIEF DESCRIPTION OF THE DRAWINGS

The just summarized invention will now be described in detail in conjunction with the drawings of which.

DETAILED DESCRIPTION OF THE PREFERRED EMBODIMENTS

Figure 1:
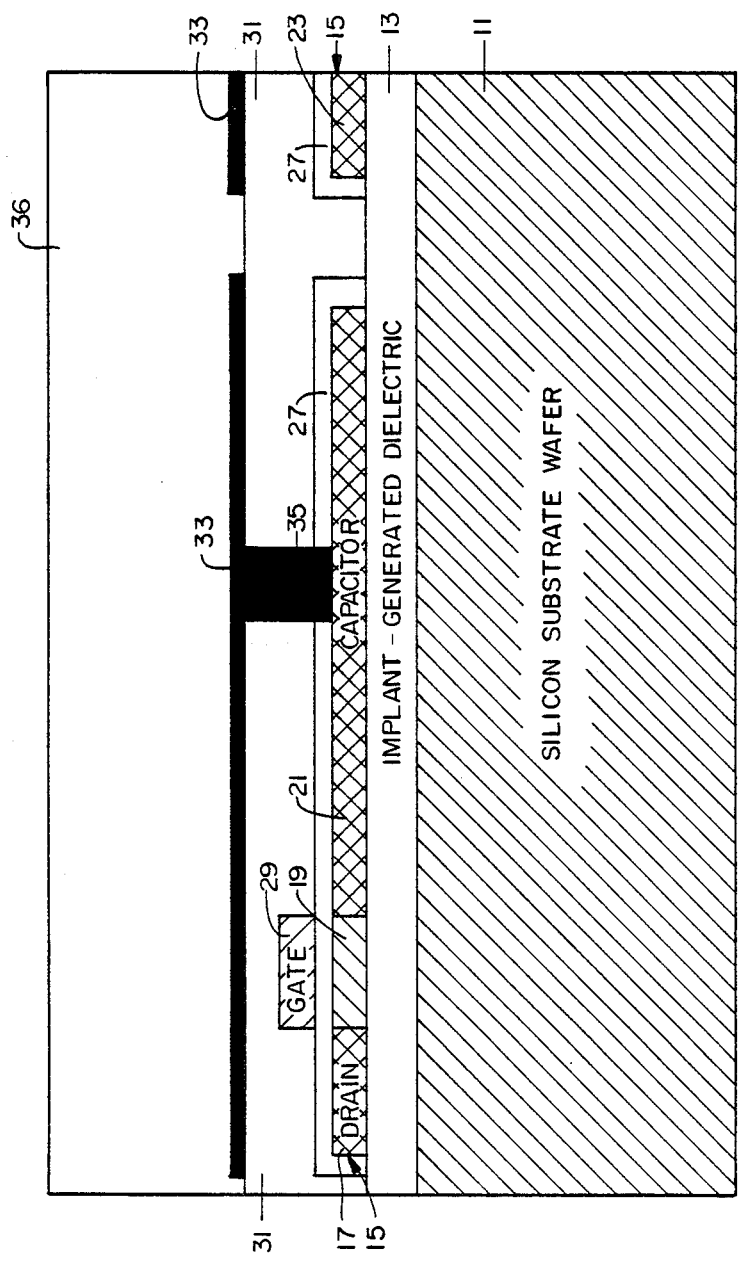
FIG. 1 is a side sectional view of a LCMOS display device according to the preferred embodiment.
Figure 2:
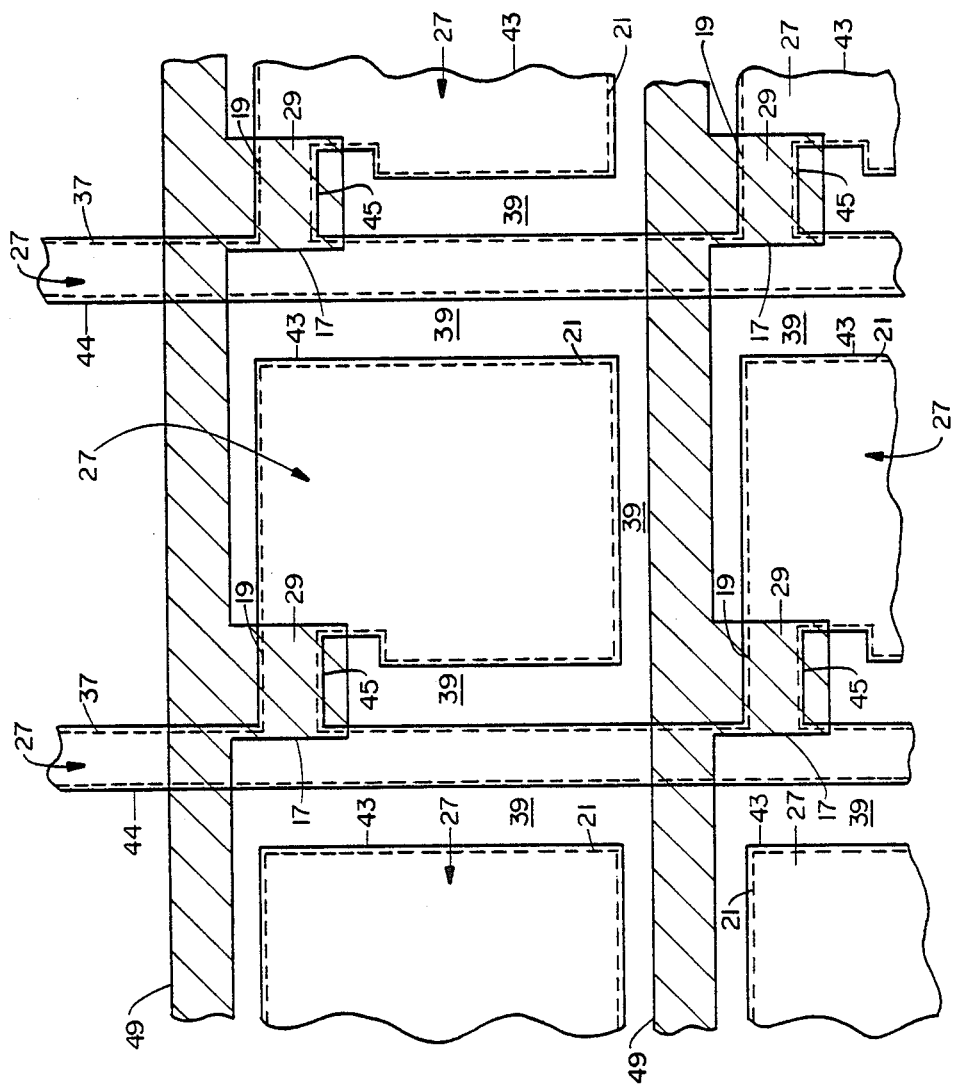
FIG. 2 is a top view of a LCMOS display device according to the preferred embodiment.

The preferred LCMOS display structure is illustrated in the cross-sectional drawing of FIG. 1 and the schematic top view of FIG. 2. In this structure, a silicon substrate wafer 11 carries an implant generated dielectric layer 13 and a silicon device layer 15. The silicon device layer 15 includes a drain 17, a channel 19, and a source/capacitor region 21 formed adjacent one another. A column supply bus 37 (FIG. 2) connected to the drain 17 is also formed in the silicon device layer 15.

An insulating layer or gate oxide 27 is formed over the drain 17, the channel 19 and the source/ capacitor region 21. A polysilicon gate 29 is formed on the oxide layer 27 over the channel 19. The polysilicon gate 29 is formed as part of a polysilicon layer which is patterned to additionally form gate supply buses 49 (FIG. 2). The gate 29, the drain 17, and the source/ capacitor 21 comprise a first field effect or MOS switch structure.

A second drain 23 is also shown in FIG. 1, separated from the first MOS switch structure by a dielectric layer 31 comprising a dielectric such as silicon dioxide (SiO₂) applied over the gate 29 and gate oxide 27 after formation of the MOS switch structures. The second drain 23 is part of a second field effect or MOS switch structure identical to the first MOS switch structure.

A pixel electrode 33 is formed over the dielectric layer 31. The pixel electrode 33 is formed of a metal conductor such as silver or aluminum and has an extension 35, which passes through an opening in the dielectric layer 31 to contact the source/capacitor 21. The remaining liquid crystal cell structure 36 formed above each pixel electrode 33 is formed according to conventional approaches.

In operation of the structure of FIG. 1, activation of the gate 29 charges a capacitor formed between the source/ capacitor region 21 and the silicon substrate 11. The source/capacitor region 21 thus forms one plate of a capacitor, the other plate of which is the substrate 11. The capacitor formed by the source/ capacitor region 21 and the substrate 11 sustains a voltage which is applied through the pixel electrode 33 to activate the liquid crystal. Typically, an analog video signal voltage level supplied to the drain 17 over the column bus 37 is transferred to the capacitor when the gate 29 is activated.

A matrix layout of devices according to FIG. 1 is illustrated in FIG. 2. FIG. 2 shows the gate oxide 27 which is formed (grown) over the silicon layer 15 in which the drains 17, channels 19, source/capacitor regions 21 and column supply buses 37 are formed. The centrally located, generally rectangular portion 43 of the gate oxide 27 overlies the source/capacitor region 21. The source/capacitor region 21 conforms to the same generally rectangular shape as, and lies slightly within the boundaries of, the overlying rectangular portion 43 of the gate oxide 27, as may also be seen in FIG. 1. The substantially rectangular portion 43 of the gate oxide 27 is connected to the portion 44 of the gate oxide 27 overlying the column supply buses 37 by a narrow channel oxide bridge 45, which generally overlies the channel 19 of the field effect device structure formed in the semiconductor layer 15.

As further shown in FIG. 2, etched out areas 39 surround the rectangular oxide structure 43. These etched out areas 39 result when the originally planar semiconductor layer 15 is etched to form islands of semiconductor material in which the field effect device drains 17, channels 19, and sources 21 are formed. The etched out areas 39 serve to define the boundaries of the individual cells or pixels of the liquid crystal display and also isolate the column buses 37 from one another.

The crosshatched area of FIG. 2 represents structure fabricated of polysilicon. The polysilicon is shaped into row electrodes 49, extensions of which form the gates 29 over the channels 19 beneath the channel oxide bridges 45.

In the prior art, drains of MOS switching devices similar in function to the drains 17 of FIG. 1 were typically fabricated as P-type diffusion structures. Such P-type diffusions have been a major source of defects in prior art displays because they are isolated from the associated substrate by only a pn junction voltage breakdown. The preferred embodiment of FIG. 1 eliminates this problem by isolating the substrate 11 from the semiconductor material 15 in which the drain 17 and the source/capacitor region 21 are formed by means of the implant-generated dielectric layer 13.

Figure 3:
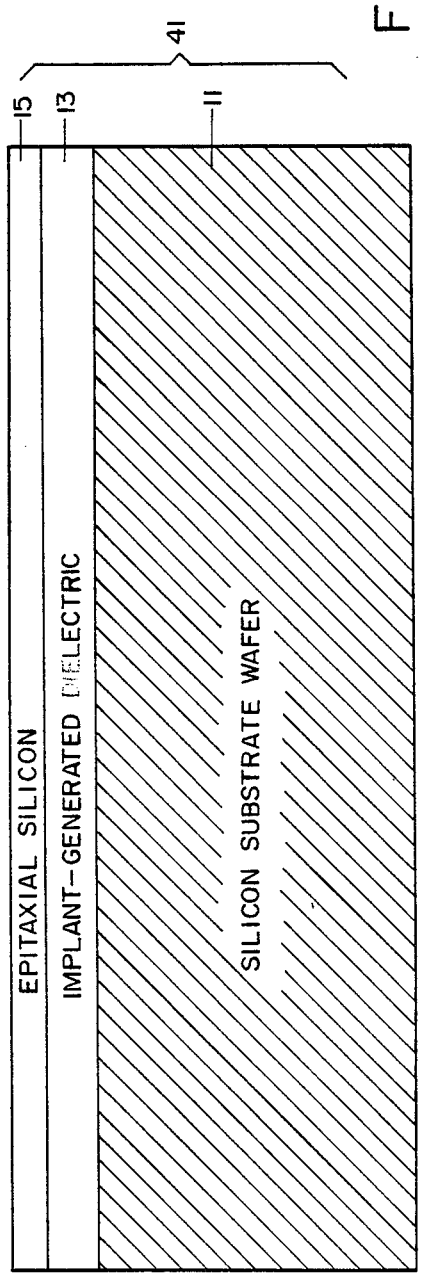
FIG. 3 is a side sectional view illustrating a stage in fabrication of an LCMOS display device according to the preferred embodiment.

The implant-generated dielectric layer 13 is initially created as part of a silicon-on-insulator (SOI) structure 41 as shown in FIG. 3. It may be noted that the process of constructing an SOI structure, such as structure 41, is known in the art per se. Nevertheless, it will be briefly described hereafter.

The SOI structure 41 is prepared by starting with a standard silicon wafer, depositing about 500 nanometers (nm) of epitaxial silicon onto it, and then implanting the wafer with a high dose of either nitrogen or oxygen, for example, $10^{17}$ to $10^{18}$ atoms/cm$^2$. The implant energy is adjusted so that the range of ion travel is peaked near the interface between the initially deposited epitaxial silicon and the substrate 11. After a thermal anneal, a structure results, which, in the case of nitrogen implantation, has 300 nm of high quality silicon 15 on top of a silicon nitride insulating layer 13 which is 400 nm thick. The interfaces between the three layers 11, 13, 15 are extremely sharp and the crystalline quality of the epitaxial silicon layer 15 is almost equivalent to bulk silicon. In this manner, the SOI structure 41 of FIG. 3 is formed, having a lightly doped epitaxial silicon layer 15 formed over a more heavily doped substrate 11.

After formation of the SOI structure 41, the doping of the field effect drains 17, channels 19, sources 21 and column buses 37 is established in the epitaxial layer 15 according to well-known procedures. The epitaxial layer 15 of the SOI structure 41 is first implanted everywhere to set channel doping. After channel doping is set by this implantation, the regions which are to become field effect device channels 19 are masked, and the remaining epitaxial layer 15 is implanted heavily, to establish doping characteristics of the source, drain and column electrodes 17, 21, 37. One example of a heavy implant of this nature is the implantation of phosphorus at an energy of 150 kiloelectron volts (KEV) to obtain a concentration of $5 \times 10^{15}$ atoms/cm$^2$. As those skilled in the art will appreciate, the exact dopant concentration used for this heavy implant are not critical. In an alternate sequence, one could employ phosphorus as a dopant with a phosphine chemical predeposition, if desired, to obtain a lower sheet resistance.

Figure 4:
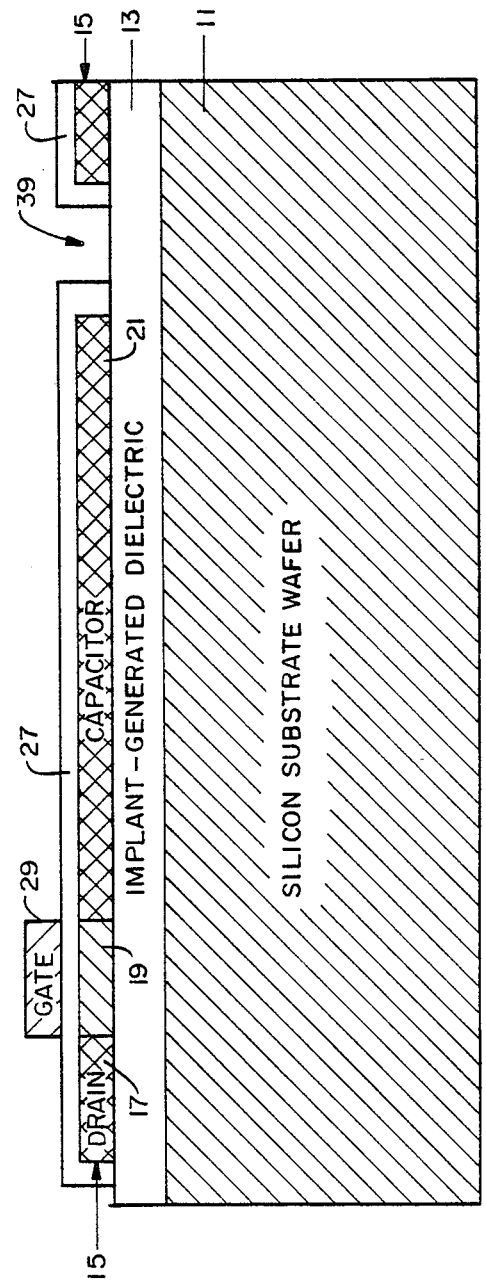
FIG. 4 is a side sectional view illustrating a more advanced stage in fabrication of a LCMOS display device according to the preferred embodiment

After establishing the field effect device doping as just described, additional well-known processing steps are performed to bring the device to the stage illustrated in FIG. 4. The epitaxial silicon layer 15 is masked with a second or "isolation" mask and chemically (wet) etched to create islands connected vertically with stripes of material. The islands include the source, drain, and channel elements of the field effect switches such as elements 17, 19, 21 of FIG. 1, while the stripes of material comprise the column buses 37. In the next step, 140 nanometers (nm) of oxide is thermally grown over the entire etched epitaxial layer 15 to form the gate oxide 27. The application of heat in this step also serves to activate the dopant implants.

A layer of polysilicon is next deposited on the gate oxide 27, doped heavily for conductivity, and then patterned to create the gates 29 and row buses 49. Alternatively, a second $5 \times 10^{15}$ dose implant of phosphorus could be used after patterning of the undoped polysilicon to dope both the polysilicon and the source and drain regions 17, 21 in a self-aligned manner, as is well-known in the art. The structure at this point is illustrated in FIG. 4.

Processing beyond this step may be identical to prior art procedures for establishing the remaining LCMOS structure, including establishment of smoothing and blocking layers. Briefly, a suitable dielectric is deposited over the structure of FIG. 4, followed by a suitable metal layer. The metal layer is patterned by a light blocking mask to prevent activation by the projection light of the display system, as taught, for example, in U.S. Pat. No. 4,239,346, assigned to Hughes Aircraft Company. A suitable dielectric is then deposited, followed by a contact masking operation (VIA). Finally, deposition and patterning of the top metal and pads metal is performed. Suitable dielectric materials for these operations include oxides or nitrides of silicon applied via low pressure chemical vapor deposition (LPCVD) or plasma enhanced chemical vapor deposition (PECVD) with typical metallization material being silver, aluminum or other similar materials, many varieties of which are known in the art.

It will be appreciated that the approach of the preferred embodiment combines some of the best features of both single crystal silicon and thin film transistor technology. Since the semiconductor material 15 is isolated from the silicon substrate 11 and can be patterned into islands, the device is less prone to leakage-induced defects, while still retaining the advantage of single crystal silicon for the actual semiconductor layer 15.

A further advantage of the preferred embodiment is that the substrate silicon wafer 11 can be used as a ground plane. This eliminates the need for a separate ground connection for the storage capacitors as was needed in some earlier LCMOS displays and simplifies the fabrication sequence, since the capacitor can be made using the silicon nitride insulator as the dielectric.

Yields are expected to be higher with the approach of the preferred embodiment due to elimination of diffusion leakage to the substrate 11, a major line-defect causing mechanism. An additional benefit is that defects in the prior art channel stop mask result primarily in shorted lines. Defects in the isolation mask which replaces the channel stop mask according to the invention result in open display lines (column buses) or in shorted display cells, neither of which are as damaging as shorted display lines. This is particularly true for open line defects which can be accommodated by redundant drive, i.e., by providing the display actuating voltage at both ends of each column bus 37.

Defects which result from polysilicon-to-silicon shorts should be reduced as well in the preferred embodiment by the layer of silicon nitride located between the polysilicon and the silicon substrate. Photolithography defects will still be present, but the elimination of two mask steps required in the prior art will help to limit their number.

Defect correction at the polysilicon level may not be necessary because of expected improved yields; however, if it is necessary it can be accomplished by etching off the gate oxide 27 after the polysilicon mask operation has been completed. This could be done with or without further masking. This approach allows defect correction at higher densities, another advantage.

The foregoing description has been directed to a preferred embodiment of a LCMOS display device employing a silicon-on-insulator substrate. Those skilled in the art will appreciate that many adaptations and variations in the preferred embodiment may be made without departing from the scope and spirit of the invention. Therefore, it is to be understood that the invention may be practiced other than as specifically described herein.

What is claimed is:

1. In a liquid crystal device having a plurality of separately activatable liquid crystal cells, the structure comprising:
   a substrate above which each of said liquid crystal cell is disposed;
   an epitaxial layer on said substrate, said epitaxial layer including a semiconductor layer overlying a first dielectric layer;
   a plurality of source, channel and drain elements formed in said semiconductor layer, each said source element comprising a first plate of a capacitor having first and second plates, the second plate comprising said substrate;
   an insulating layer formed on said semiconductor layer;
   a gate element formed on said insulating layer above each said channel element;
   a second dielectric layer formed over each said gate element and said insulating layer; and
   a plurality of electrodes, each for activating one of said cells formed on said second dielectric layer and having an extension extending through said second dielectric layer and insulting layer to contact one of said source elements; wherein said substrate comprises a substrate free of localized diffusions.

2. The liquid crystal device of claim 1 wherein said first dielectriclayer comprises an ion implanted region of said epitaxial layer.

* * * * *